US011043177B2

(12) United States Patent
Chen

(10) Patent No.: US 11,043,177 B2
(45) Date of Patent: Jun. 22, 2021

(54) SHIFT REGISTER

(71) Applicant: AU Optronics Corporation, Hsin-Chu (TW)

(72) Inventor: Ping-Lin Chen, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/510,069

(22) Filed: Jul. 12, 2019

(65) Prior Publication Data

US 2020/0219459 A1  Jul. 9, 2020

(30) Foreign Application Priority Data

Jan. 7, 2019  (TW) ................................. 108100580

(51) Int. Cl.
| | | |
|---|---|---|
| *G11C 19/00* | (2006.01) | |
| *G09G 3/36* | (2006.01) | |
| *G06F 3/041* | (2006.01) | |
| *G11C 19/28* | (2006.01) | |
| *G09G 3/20* | (2006.01) | |

(52) U.S. Cl.
CPC ......... *G09G 3/3677* (2013.01); *G06F 3/0412* (2013.01); *G06F 3/0416* (2013.01); *G09G 3/20* (2013.01); *G11C 19/00* (2013.01); *G11C 19/28* (2013.01); *G11C 19/287* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 9,972,270 B1 * | 5/2018 | Cao | ......................... | G11C 19/28 |
| 2016/0266699 A1 * | 9/2016 | Zhao | ........................ | G06F 3/044 |
| 2016/0365061 A1 * | 12/2016 | Hong | ...................... | G11C 19/28 |
| 2017/0123556 A1 * | 5/2017 | Lin | ......................... | G06F 3/0416 |
| 2017/0186352 A1 * | 6/2017 | Lin | ........................... | G09G 3/20 |
| 2017/0199617 A1 * | 7/2017 | Gu | ........................ | G11C 19/287 |
| 2018/0046311 A1 * | 2/2018 | Gu | ......................... | G06F 3/0416 |
| 2018/0299988 A1 * | 10/2018 | Chen | ....................... | G06F 3/044 |
| 2019/0064978 A1 * | 2/2019 | Tu | .......................... | G06F 3/0416 |
| 2019/0096500 A1 * | 3/2019 | Gu | ............................ | G09G 3/20 |
| 2019/0164514 A1 | 5/2019 | Gong | | |
| 2020/0042153 A1 * | 2/2020 | Yang | ................... | G06F 3/04166 |

FOREIGN PATENT DOCUMENTS

TW    I638348 B    10/2018

* cited by examiner

*Primary Examiner* — Tuan T Lam
(74) *Attorney, Agent, or Firm* — WPAT, PC

(57) ABSTRACT

A shift register is disclosed herein. The shift register includes a pull down circuit, a supplementary circuit, an output control circuit, and an input circuit. The supplementary circuit is coupled to the pull down circuit at a first node and a second node and is configured to receive a touch signal. The output control circuit is coupled to the second node. The input circuit is coupled to the first node and is configured to transmit an input voltage to the first node and the second node according to an input signal. The supplementary circuit transmits a voltage value of the touch signal to the second node according to the input voltage and the touch signal, so as to maintain a voltage value of the second node.

6 Claims, 3 Drawing Sheets

SHIFT REGISTER

CROSS-REFERENCE TO RELATED APPLICATION

This application claims the priority benefit of TAIWAN Application serial no. 108100580, filed Jan. 7, 2019, the full disclosure of which is incorporated herein by reference.

FIELD OF INVENTION

The invention relates to a shift register. More particularly, the invention relates to a shift register which maintains voltage through the supplementary circuit.

BACKGROUND

The touch display panel includes a driver and a source driver. In the current touch display panel design, the gate driver is configured to output scan signals to the touch display panel at regular intervals. The gate driver includes several shift registers, and each shift register delays the input signal as output signals according to the clock signal. The shift register of the next stage utilizes the output signal of the shift register of the previous stage as the input signal, and delays the output to become its own output signals.

In detail, the input signal of the shift register is temporarily stored in the control terminal of the output control circuit of the shift register, and then the gate signal and the output signal are output via the output control circuit according to the clock signal. However, the voltage of the control terminal of the output control circuit temporarily stored in the shift register will drop due to the leakage of the pull down circuit itself, which may cause the output signals unable to be transmitted when the clock signal is activated after the touch sensing operation is completed.

SUMMARY

An embodiment of this disclosure is to provide a touch display device. The shift register includes a pull down circuit, a supplementary circuit, an output control circuit, and an input circuit. The supplementary circuit is coupled to the pull down circuit at a first node and a second node and is configured to receive a touch signal. The output control circuit is coupled to the second node. The input circuit is coupled to the first node and is configured to transmit an input voltage to the first node and the second node according to an input signal. The supplementary circuit transmits a voltage value of the touch signal to the second node according to the input voltage and the touch signal, so as to maintain a voltage value of the second node.

An embodiment of this disclosure is to provide a shift register. The shift register includes a pull down circuit, a supplementary circuit, an output control circuit, and an input circuit. The supplementary circuit is coupled to a first node and a second node of the pull down circuit. The supplementary circuit includes a first transistor, a second transistor, a third transistor, a fourth transistor, a fifth transistor, and a sixth transistor. A first terminal of the first transistor is configured to receive a touch signal, and a second terminal of the first transistor is coupled to the second node. A control terminal of the second transistor is coupled to a first terminal of the second transistor at a first power source, and a second terminal of the second transistor is coupled at a third node. A control terminal of the third transistor is configured to receive the touch signal, and a first terminal of the third transistor is coupled to the third node. A first terminal of the fourth transistor is coupled to a second terminal of the third transistor, a second terminal of the fourth transistor is coupled to a second power source, and a control terminal of the fourth transistor is coupled to the first node. A control terminal of the fifth transistor and a first terminal of the fifth transistor are configured to receive the touch signal, and a second terminal of the fifth transistor is coupled to a fourth node. A second terminal of the sixth transistor is coupled to the second power source, a control terminal of the sixth transistor is coupled to the third node, and a first terminal of the sixth transistor and a control terminal of the first transistor are coupled to the fourth node. The output control circuit is coupled to the second node. The input circuit is coupled to the first node.

Therefore, according to the technical concept of the present invention, embodiments of this disclosure are to provide a shift register. Under the original shift register architecture, a supplementary circuit that does not require a capacitor is externally connected, and the touch signal and the input signal are utilized as logic inputs. When the voltages of the touch signal and the input signal are simultaneously high (i.e., the touch display panel performs touch sensing), the shift register charges the voltage of the control terminal of the output control circuit. The problem that the output signals cannot be transmitted due to the long time of the touch sensing time is avoided. Since this supplementary circuit does not require additional external capacitors, a significant increase in the area of the shift register due to the applied capacitance to the shift register may be avoided.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
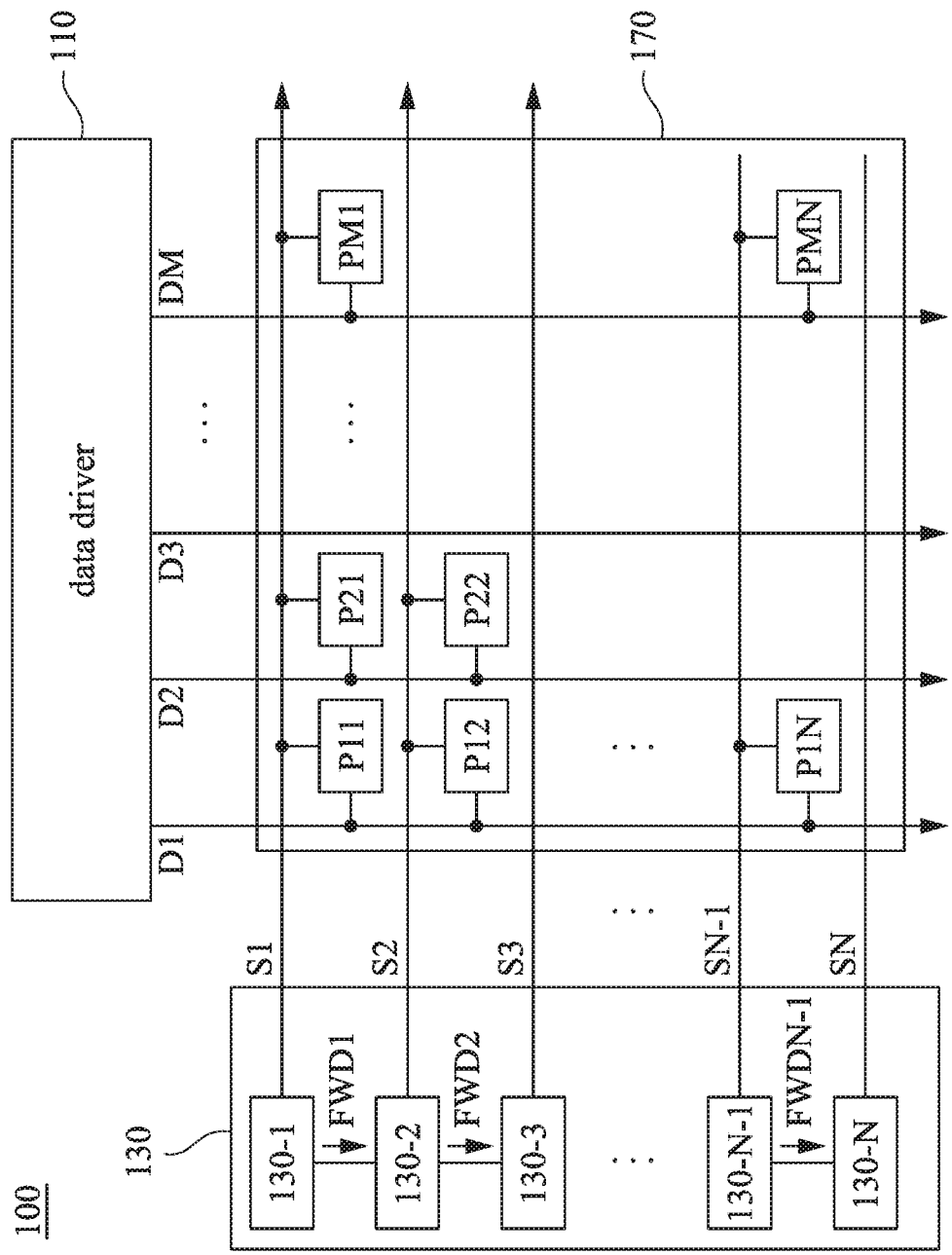
FIG. 1 is a schematic diagram illustrating a touch display panel according to some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention.

Reference is made to FIG. 1. FIG. 1 is a schematic diagram illustrating a touch display panel 100 according to some embodiments of the present disclosure. As illustrated in FIG. 1, the touch display panel 100 includes a data driver 110, a gate driver 130, and a display area 170. The display area 170 includes several display circuits P11 to PMN. The gate driver 130 includes several shift registers 130-1 to 130-N. multi-stages of the shift registers 130-1 to 130-N couple to one of the several scanning lines S1 to SN respectively. Several display circuits P11 to PMN couple to one of the several scanning lines S1 to SN respectively, and couples to one of the several data lines D1 to DM.

In some embodiments, every one of the multi-stages of the shift registers 130-1 to 130-N generates output signals FWD1 to FWDN respectively, and transmits the output signals FWD1 to FWDN to the next stage of the multi-stages of the shift registers 130-1 to 130-N. For example, as illustrated in FIG. 1, the shift register 130-1 transmits the output signal FWD1 to the shift register 130-2, and the shift register 130-2 transmits the output signal FWD2 to the shift register 130-3, and so on.

Figure 2:
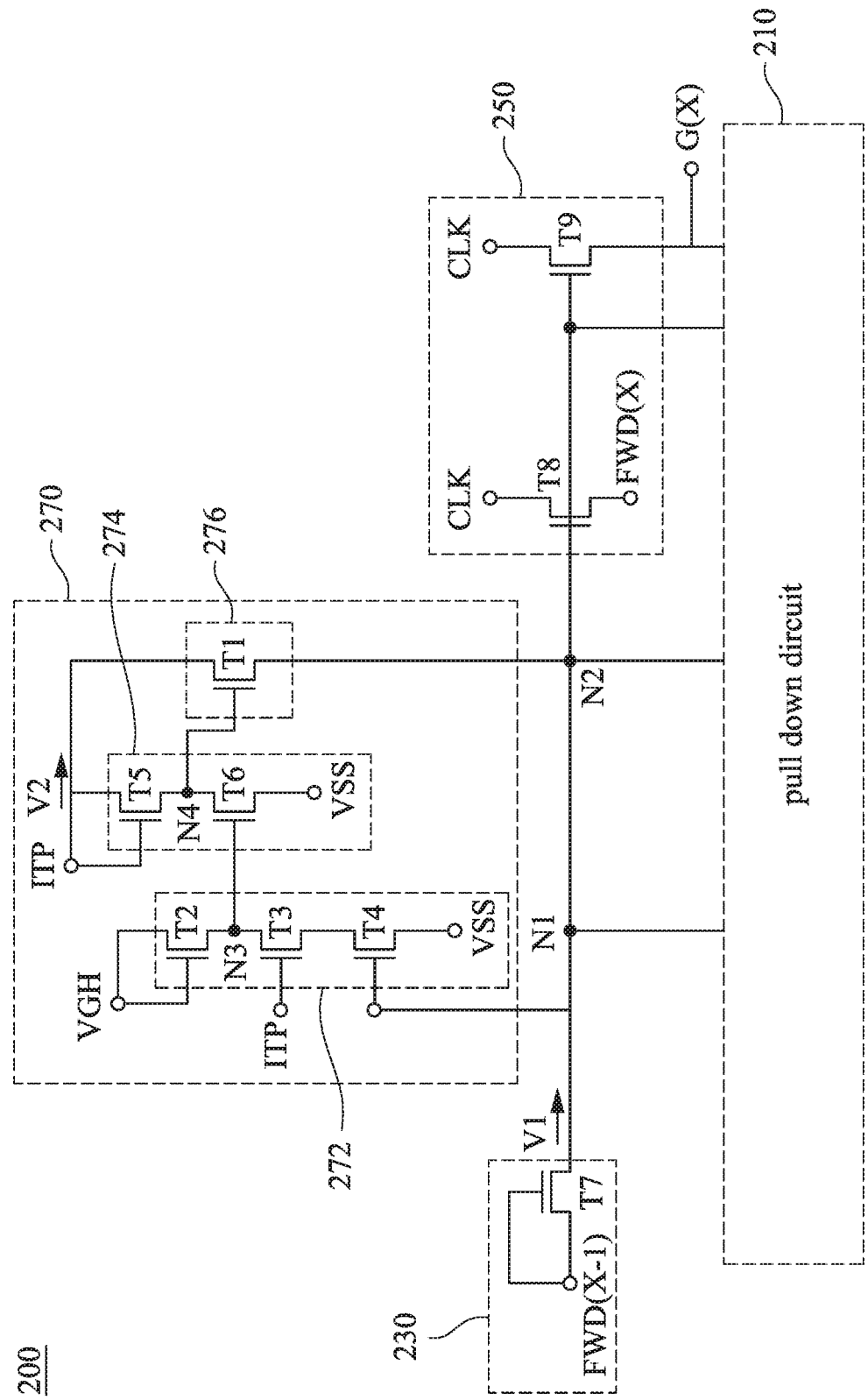
FIG. 2 is a schematic diagram illustrating a shift register according to some embodiments of the present disclosure.

Reference is made to FIG. 2. FIG. 2 is a schematic diagram illustrating a shift register 200 according to some embodiments of the present disclosure. The shift register 200 may represent any one of the shift registers 130-1 to 130-N in FIG. 1. As illustrated in FIG. 2, the shift register 200 includes the pull down circuit 210, the input circuit 230, the output control circuit 250, and the supplementary circuit 270.

In the connection relationship, the supplementary circuit 270 and the pull down circuit 210 couple to the nodes N1, N2. The output control circuit 250 couples to the node N2, the input circuit 230 couples to the node N1, and the pull down circuit 210 couples to the nodes N1, N2.

In the operation relationship, the input circuit 230 transmits the input voltage V1 to the nodes N1, N2 according to the input signal FWD(X−1). The supplementary circuit 270 transmits the voltage value of the touch signal ITP to the node N2 according to the input voltage V1 and the voltage value of the touch signal ITP, so as to maintain the voltage value of the node N2. The input signal FWD(X−1) as mentioning above is the output signal of the previous stage of the shift register 130-X−1. The output signal FWD(X) of the current stage of the shift register 130-X is the input signal of the next stage of the shift register 130-X+1.

The supplementary circuit 270 includes the circuit 272, the circuit 274, and the charging circuit 276. In the connection relationship, the circuit 272 is coupled to the node N1, the circuit 274 is coupled to the circuit 272, and the charging circuit 276 is coupled to the node N2. In the operation relationship, when the circuit 272 is conducted according to the input voltage V1 and the voltage value of the touch signal ITP, the circuit 274 is conducted. When the circuit 274 is conducted, the charging circuit 276 is conducted.

In detail, the charging circuit 276 includes the transistor T1. The circuit 272 includes the transistor T2, T3 and T4. The circuit 274 includes the transistor T5 and T6. In the connection relationship, the first terminal of the transistor T1 is configured to receive the touch signal ITP, the second terminal of the transistor T1 is coupled to the node N2, the control terminal of the transistor T1 is coupled to the node N4. The control terminal of the transistor T2 and the first terminal of the transistor T2 are coupled to the power source VGH, the second terminal of the transistor T2 is coupled to the node N3. The control terminal of the transistor T3 is configured to receive the touch signal ITP, the first terminal of the transistor T3 is coupled to the node N3, the second terminal of the transistor T3 is coupled to the transistor T4. The second terminal of the transistor T4 is coupled to the power source VSS, the control terminal of the transistor T4 is coupled to the node N1. The control terminal of the transistor T5 and the first terminal of the transistor T5 are configured to receive the touch signal ITP, the second terminal of the transistor T5 is coupled to the node N4. The control terminal of the transistor T6 is coupled to the node N3, the first terminal of the transistor T6 is coupled to the node N4, the second terminal of the transistor T6 is coupled to the power source VSS.

As the embodiments illustrated in FIG. 2, the power source VGH is the high voltage, and the power source VSS is the low voltage. However, the embodiments of the present disclosure are not limited thereto.

Furthermore, the input circuit 230 includes the transistor T7. The output control circuit 250 includes the transistors T8, T9. The control terminal of the transistor T7 and the first terminal of the transistor T7 are coupled to the input signal FWD(X−1), the second terminal of the transistor T7 is coupled to the node N1. The control terminal of the transistor T8 is coupled to the node N2, the first terminal of the transistor T8 is configured to receive the clock signal CLK, the second terminal of the transistor T8 is configured to output signal FWD(X). The control terminal of the transistor T9 is coupled to the node N2, the first terminal of the transistor T9 is configured to receive the clock signal CLK, the second terminal of the transistor T9 is coupled to the pull down circuit 210.

In the operational relationship, when the voltage value of the input signal FWD(X−1) is high, the high voltage value V1 of the input signal FWD(X−1) is transmitted to the nodes N1, N2 through the transistor T7. However, during the touch sensing operation, the voltage value of the node N2 may drop due to leakage of the pull down circuit 210. Under the circumstances, when the touch sensing operation is finished, the voltage value of the node N2 may be too low, and it becomes unable to conduct the transistors T8 and T9. This may cause the clock signal CLK unable to pass down to the shift register 130-X+1 of the next stage.

In the embodiments of the present disclosure, reference is made to FIG. 2. When both of the voltage value of the input signal FWD(X−1) and the voltage value of the touch signal ITP are high, the transistors T3 and T4 are conducted, the current flows from the power source VGH via the transistors T2, T3, T4 to the power source VSS. At this time, the voltage value of the node N3 is high, the transistor T6 is conducted. After the transistor T6 is conducted, the current flows from a terminal of the transistor T5, wherein the transistor T5 is coupled to the touch signal ITP via the transistors T5 and T6 to the power source VSS. At this time, the voltage value of the node N4 is high, the transistor T1 is conducted. After the transistor T1 is conducted, the touch signal ITP is transmitted to the node N2 via the transistor T1. That is, when both of the voltage value of the input signal FWD(X−1) and the voltage value of the touch signal ITP are high, the transistor T1 conducted the touch signal ITP, the high voltage value is transmitted to the node N2 via the transistor T1, so as to charge the node N2. In this way, the voltage value of the node N2 will not fall during touch sensing, which causes the clock signal CLK unable to be transmitted to the next stage of the shift register 130-X+1.

On the other hand, when the voltage value of the input signal FWD(X−1) is low, the voltage value of the node N1 is low, the transistor T4 is not conducted. When the voltage value of the touch signal ITP is low, the transistor T3 is not conducted. Under these two situations, no current flows from the power source VGH to the power source VSS via transistor T2, T3, T4. At this time, the voltage value of the node N3 is not high, the transistor T6 is not conducted. When the transistor T6 is not conducted, the current may not flow from a terminal of the transistor T5, which is coupled to the touch signal ITP to the power source VSS via the transistors T5 and T6. At this time, the voltage value of the node N4 is not high, and the transistor T is not conducted. Since the transistor T1 is not conducted, the touch signal ITP may not be transmit to the node N2 via the transistor T1. That is, in the embodiments of the present disclosure, only when both of the voltage value of the input signal FWD(X−1) and the voltage value of the touch signal ITP are high, the supplementary circuit 270 charges the node N2.

In some embodiments, the driving capability of the transistors T3, T4 is larger than the driving capability of the transistor T2. The driving capability of the transistor T6 is larger than the driving capability of the transistor T5. In some embodiments, width to length ratio of the channel (W/L) of the transistors T3, T4 is 50, and the width to length ratio (W/L) of the channel of the transistor T2 is 15. The width to length ratio (W/L) of the channel of the transistor T5 (W/L) is 50, and the width to length ratio (W/L) of the channel of the transistor T6 is 100. The width to length ratios (W/L) of the channels as mentioning above are for illustrative purposes only, and the embodiments of the current disclosure are not limited thereto.

Figure 3:
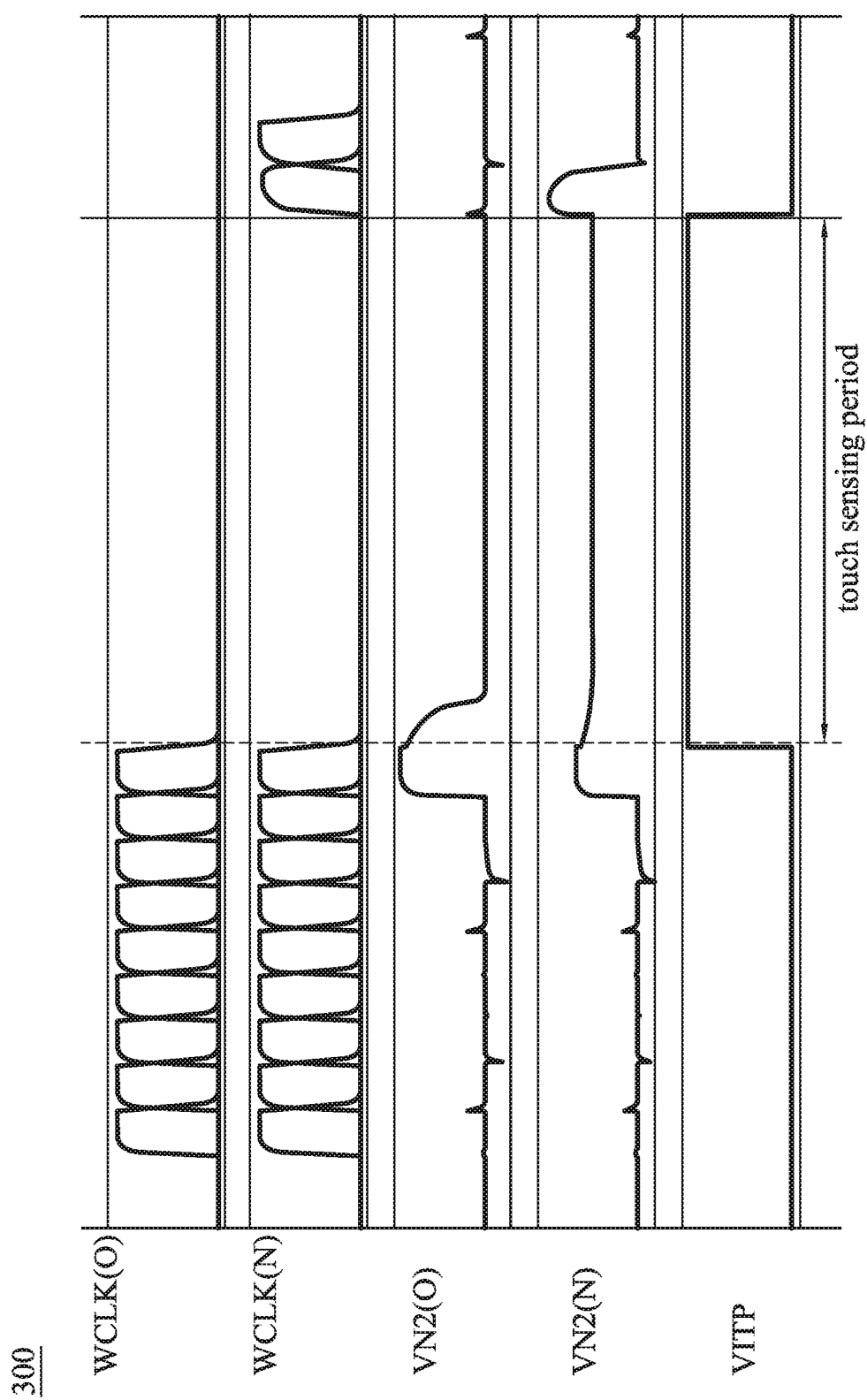
FIG. 3 is an experimental data diagram according to some embodiments of the present disclosure.

Reference is made to FIG. 3. FIG. 3 is an experimental data diagram 300 according to some embodiments of the present disclosure. In the experimental data diagram 300, the WCLK (O) is a waveform figure of the output signal FWD(X) without the supplementary circuit 270. WCLK (N) is a waveform figure of the output signal FWD(X) with the supplementary circuit 270 according to the embodiments of the present disclosure. VN2 (O) is a waveform figure of the voltage value of the node N2 without the supplementary circuit 270, VN2 (N) is a waveform figure of the voltage value of the node N2 without the supplementary circuit 270 according to the embodiments of the present disclosure. VITP is a waveform figure of the touch signal ITP.

It may be known from FIG. 3, under the situation without the supplementary circuit 270, during the touch sensing period (that is, when the voltage value of the touch signal ITP is high), the voltage value of the node N2 falls due to leakage, and at the terminal of touch sensing, since the voltage value of the node N2 is too low, the clock signal CLK is unable to be output. However, in the embodiments of the present disclosure, under the situation with the supplementary circuit 270, during the touch sensing, the supplementary circuit 270 charges the node N2, so as to keep the voltage value of the node N2 at high potential. In this way, after the touch sensing is finished, since the voltage value of the node N2 is still at high potential, the clock signal CLK may be output normally.

On the implementation, the transistors T1 to T9 as illustrated in FIG. 2 may be realized by a P-type low temperature polysilicon film transistor, however, the embodiments of the present disclosure is not limited thereto. For example, the transistors T1 to T9 may also be realized by the P-type amorphous silicon film transistor. In some embodiments, it may also be implemented using an N-type thin film transistor, and the embodiments of the present disclosure is not limited thereto.

According to the embodiments of the present disclosure, the embodiments of the present disclosure provides a shift register, under the architecture of the original shift register, a supplementary circuit that does not require a capacitor is externally connected, the touch signal and the input signal are configured to be logical input terminals. When both of the voltage of the touch signal and the input signal are high at the same time (that is, when the touch display panel is under touch sensing operation), the shift register may charge the voltage of the control terminal of the output control circuit, so as to avoid leakage due to excessive touch sensing time, which causes problems that output signals cannot be transmitted. Since the supplementary circuit does not require additional external capacitors, a significant increase in the area of the shift register due to the applied capacitance to the shift register may be avoided.

In this document, the term "coupled" may also be termed as "electrically coupled", and the term "connected" may be termed as "electrically connected". "Coupled" and "connected" may also be used to indicate that two or more elements cooperate or interact with each other. It will be understood that, although the terms "first," "second," etc., may be used herein to describe various elements, these elements should not be limited by these terms. These terms are used to distinguish one unit from another. For example, a first unit could be termed a second element, and, similarly, a second unit could be termed a first element, without departing from the scope of the embodiments. As used herein, the term "and/or" includes any and all combinations of one or more of the associated listed items.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A shift register, comprising:
a pull down circuit;
a supplementary circuit, coupled to the pull down circuit at a first node and a second node, and configured to receive a touch signal;
an output control circuit, coupled to the second node; and
an input circuit, coupled to the first node, and configured to transmit an input voltage to the first node and the second node according to an input signal;
wherein the supplementary circuit transmits a voltage value of the touch signal to the second node according to the input voltage and the touch signal, so as to maintain a voltage value of the second node,
wherein the supplementary circuit comprises:
a first circuit, coupled to the first node;
a second circuit, coupled to the first circuit; and a charging circuit, coupled to the second node, wherein when the first circuit is conducted according to the input voltage and the touch signal, the second circuit is conducted, and when the second circuit is conducted, the charging circuit is conducted.

2. The shift register of claim 1, wherein the charging circuit comprises a first transistor, a first terminal of the first transistor is configured to receive the touch signal, a control terminal of the first transistor is coupled to the second circuit, and a second terminal of the first transistor is coupled to the second node.

3. The shift register of claim 1, wherein the first circuit comprises:
   a second transistor, wherein a control terminal of the second transistor and a first terminal of the second transistor are coupled to a first power source, and a second terminal of the second transistor is coupled to a third node;
   a third transistor, wherein a control terminal of the third transistor is configured to receive the touch signal, and a first terminal of the third transistor is coupled to the third node; and
   a fourth transistor, wherein a first terminal of the fourth transistor is coupled to a second terminal of the third transistor, a second terminal of the fourth transistor is coupled to a second power source, and a control terminal of the fourth transistor is coupled to the first node.

4. The shift register of claim 3, wherein each of a driving capability of the third transistor and a driving capability of the fourth transistor is larger than a driving capability of the second transistor.

5. The shift register of claim 3, wherein the second circuit comprises:
   a fifth transistor, wherein a control terminal of the fifth transistor and a first terminal of the fifth transistor are configured to receive the touch signal; and
   a sixth transistor, wherein a first terminal of the sixth transistor is coupled to a second terminal of the fifth transistor, a second terminal of the sixth transistor is coupled to a second power source, and a control terminal of the sixth transistor is coupled to the first circuit.

6. The shift register of claim 5, wherein a conduction capability of the sixth transistor is larger than a conduction capability of the fifth transistor.

* * * * *